United States Patent
Pornin et al.

(10) Patent No.: US 10,629,361 B2
(45) Date of Patent: Apr. 21, 2020

(54) INDUCTANCE DEVICE AND METHOD OF MANUFACTURING THE SAME

(71) Applicant: COMMISSARIAT A L'ENERGIE ATOMIQUE ET AUX ENERGIES ALTERNATIVES, Paris (FR)

(72) Inventors: Jean-Louis Pornin, Crolles (FR); Gabriel Pares, Bernin (FR); Bruno Reig, Moirans (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 229 days.

(21) Appl. No.: 15/380,567

(22) Filed: Dec. 15, 2016

(65) Prior Publication Data

US 2017/0178791 A1 Jun. 22, 2017

(30) Foreign Application Priority Data

Dec. 16, 2015 (FR) .................................... 15 62448

(51) Int. Cl.
*H01F 5/00* (2006.01)
*H01F 27/28* (2006.01)
(Continued)

(52) U.S. Cl.
CPC ........... *H01F 27/2804* (2013.01); *H01F 5/00* (2013.01); *H01F 17/0013* (2013.01);
(Continued)

(58) Field of Classification Search
CPC ............................. H01F 5/00; H01F 27/00–36
(Continued)

(56) References Cited

U.S. PATENT DOCUMENTS 7,355,264 B2 * 4/2008 Degani ............... H01F 17/0006
257/528
7,948,346 B2 * 5/2011 Hebert ................ H01F 17/0033
336/200
(Continued)

FOREIGN PATENT DOCUMENTS

| JP | 2001-77538 | | 3/2001 |
| JP | 2001077538 A | * | 3/2001 |
| KR | 10-2009-0127245 | | 12/2009 |

OTHER PUBLICATIONS

Ji Chen et al. "On-Chip Spiral Inductors for RF Applications: An Overview," Journal of Semiconductor Technology and Science, vol. 4, No. 3, Sep. 2004, pp. 19.
(Continued)

*Primary Examiner* — Tuyen T Nguyen
(74) *Attorney, Agent, or Firm* — Oblon, McClelland, Maier & Neustadt, L.L.P.

(57) ABSTRACT

An inductance device includes a coil provided with at least one electrically conductive turn having a first portion of turn formed on a face of a first substrate, and a second portion of turn. A first end of the first portion is electrically connected to a first end of the second portion by a conductive connection, and the coil has a longitudinal axis, around which the at least one turn is formed, which is perpendicular to a dimension in thickness of the first substrate. The second portion is formed on a face of a second substrate different from the first substrate, with the face of the first substrate facing the face of the second substrate, with the conductive connection extending into an interstitial space located between the face of the first substrate and the face of the second substrate.

15 Claims, 6 Drawing Sheets

(51) Int. Cl.
*H01F 17/00* (2006.01)
*H01L 23/00* (2006.01)
*H01F 27/29* (2006.01)
*H01L 23/522* (2006.01)
*H01L 23/64* (2006.01)
*H01F 41/04* (2006.01)
*H01L 49/02* (2006.01)

(52) U.S. Cl.
CPC ......... *H01F 27/292* (2013.01); *H01F 41/041* (2013.01); *H01L 23/5227* (2013.01); *H01L 23/645* (2013.01); *H01L 24/00* (2013.01); *H01F 2017/004* (2013.01); *H01F 2027/2809* (2013.01); *H01L 28/10* (2013.01); *H01L 2224/13111* (2013.01); *H01L 2224/16* (2013.01); *H01L 2224/81815* (2013.01); *H01L 2924/1304* (2013.01); *H01L 2924/1306* (2013.01)

(58) Field of Classification Search
USPC ............ 336/65, 83, 180–184, 200, 206–208, 336/232–234
See application file for complete search history.

(56) References Cited

U.S. PATENT DOCUMENTS

| | | | |
|---|---|---|---|
| 9,406,438 B2* | 8/2016 | Yokoyama | ............. H01F 27/25 |
| 2010/0022063 A1 | 1/2010 | Erturk et al. | |
| 2011/0050357 A1 | 3/2011 | Kim et al. | |
| 2015/0069572 A1 | 3/2015 | Khanolkar et al. | |

OTHER PUBLICATIONS

Olivier Tesson et al. "Electro-Magnetic Modeling and Design of Through Silicon Vias Based Passive Interposers for High Performance Applications up to the V-Band," International Journal on Advances in Systems and Measurements, vol. 5 No. 1 & 2, http://www.iariajournals.org/systems_and_measurements/, 2012, pp. 15.

H. Takacs et al. "New approach to closely-spaced disordered cobalt-graphene polymer nanocomposites for non conductive RF ferromagnetic films," IEEE Transactions on Magnetics, 2015, pp. 4.

French Preliminary Search Report dated Aug. 30, 2016 in French Application 15 62448 filed on Dec. 16, 2015 (with English Translation of Categories of Cited Documents and Written Opinion).

* cited by examiner

INDUCTANCE DEVICE AND METHOD OF MANUFACTURING THE SAME

FIELD OF THE INVENTION

This invention in general relates to the realization of microelectronic components and more particularly of hybrid inductive components intended to be used very close with devices of the type of those produced by the microelectronics industry such as integrated circuits.

TECHNOLOGICAL BACKGROUND

The obtaining of microelectronic components intended to be used with the types of complex devices produced by the microelectronics industry such as integrated circuits and more generally circuits that also include mechanical and/or optical functions such as MEMS and/or NEMS (micro or nano electro mechanical systems) come up against many difficulties. This is in particular the case when it entails obtaining high electrical values from these passive components in a restricted space and as close as possible to the latter in order to limit the effects of the interference of their use in the considered application.

The full integration of such a passive component with the integrated circuit that us using it does not necessarily provide an entirely satisfying solution. Such an example of integration of an inductive component, i.e. a coil or self, is described for example in the publication entitled "*Electro-Magnetic Modeling and Design of Through Silicon Vias Based Passive Interposers for High Performance Applications up to the V-Band*" published in 2012 in "*International Journal on Advances in Systems and Measurements, vol. 5 no. 1 & 2*" by Olivier Tesson and his co-authors. The latter describes therein an inductive component that uses the substrate of the integrated circuit as an insulating layer in order to define the height of the turns of the coil. Metal traces which form in part the turns of the coil are defined on either side of the substrate, the interconnections to connect the metal traces together and former a coil are provided by through silicon vias (TSV).

In this case, one of the limitations will be the aspect ratio, i.e. the ratio of the diameter over the depth of the through vias which will either limit the thickness of the substrate, or impose a substantial space between two adjacent turns. It will also be difficult to integrate a magnetic material in the turns.

It is therefore an object of the invention to overcome at least partially the disadvantages of the current techniques of realizing passive components, and in particular inductive components as shown in the publication hereinabove, by describing a method that does not add any constraint to the integrated circuit that must use them. It is in particular an object of the invention that the value of the inductance can be adjusted without any disadvantage for the integrated circuit while still maintaining a level of integration similar to that that would be obtained with a full integration of the passive component.

SUMMARY OF THE INVENTION

An aspect of this invention relates to a microelectronic component comprising a coil provided with at least one electrically conductive turn comprising a first portion of turn formed on a first substrate, and a second portion of turn, with a first end of the first portion being electrically connected to a first end of the second portion by a conductive connection, with the coil having a longitudinal axis, around which the at least one turn is formed, which is perpendicular to a direction according to a thickness of the first substrate.

Advantageously, the second portion is formed on a second substrate different from the first substrate, a first face of the first substrate facing a first face of the second substrate, with the conductive connection extending at least into an interstitial space located between the first face of the first substrate and the first face of the second substrate.

As such, the two portions of turn can be carried out separately on the surface of two substrates. The latter can be of different natures. Furthermore, the conductive connections between the portions of turn are arranged in the space between the two substrates. This space can be chosen from a wide range of thicknesses and the conductive connections chosen in consequence. In this way, the inductance of the device, which is according to the height of the connections in question as they participate in the coil, is easily adjustable and can have a value that is very different from one device to another.

High inductance values can be reached as the invention is not constrained to the manufacturing limits for connections such as vias. The space can be filled with a magnetic material intended to increase the value of the inductance.

This invention also relates to, in embodiments, a method for manufacturing an inductive component comprising a coil provided with at least one electrically conductive turn, comprising:

forming a first portion of turn on a first substrate, and forming a second portion of turn, with the coil having a longitudinal axis, around which the at least one turn is formed, which is perpendicular to a direction according to a thickness of the first substrate;

electrically connecting a first end of the first portion to a first end of the second portion by a conductive connection.

Advantageously, forming the second portion is carried out on a second substrate different from the first substrate, with a first face of the first substrate facing a first face of the second substrate, with the conductive connection extending into an interstitial space located between the first face of the first substrate and the first face of the second substrate.

Another aspect of embodiments of the invention relates to an electronic system comprising at least one inductive component as described hereinabove.

BRIEF INTRODUCTION OF THE FIGURES

Other characteristics, purposes and advantages of this invention shall appear when reading the following detailed description, with respect to the annexed drawings, provided as non-limiting examples, and wherein.

The FIG. 6 is a plan view of an inductive component according to the invention after assembly of the substrates.

The drawings are provided by way of examples and do not limit the invention. They form diagrammatical block diagrams intended to facilitate the understanding of the invention and are not necessarily to the scale of the practical applications. In particular, the relative thicknesses of the various layers and substrates may not be representative of reality.

DETAILED DESCRIPTION

Before beginning a detailed review of the embodiments of the invention, optional characteristics are mentioned hereinafter which may be used according to any combination or alternatively:

- the first portion is formed on the first face of the first substrate or on a second face of the first substrate opposite the first face and/or the second portion is formed on the first face of the second substrate or on a second face of the second substrate opposite the first face;
- the conductive connection comprises a portion that extends into the interstitial space and comprises a portion extending into at least one of the first substrate and second substrate;
- the portion of the conductive connection extending into at least one of the first substrate and second substrate comprises at least one conductive via passing through said at least one of the first substrate and second substrate;
- it comprises at least one substrate inserted between the first substrate and the second substrate, with the conductive connection comprising a portion extending through the at least one inserted substrate;
- the portion of the conductive connection extending through the at least one inserted substrate comprises at least one conductive via passing through said at least one inserted substrate;
- the conductive connection is configured to produce a mechanical assembly of the first and second portions;
- the conductive connection comprises at least one among the following elements: an electrically conductive layer, a micro-tube or an electrically conductive micropillar, an electrically conductive ball, a paste or an anisotropic conductive film;
- the connection has a non-zero dimension, according to the direction in thickness of the first substrate;
- the conductive connection comprises a zone in electrical continuity of the first end of the first portion, a zone in electrical continuity of the first end of the second portion, said zones being assembled, preferably by direct bonding with or without thermocompression; these zones can each be in the plane of one of the portion of turns, to the extent that the assembly is carried out without substantial space between the faces of the substrates. These zones can also be in the thickness of the conductive connection, for example between the inserted substrates which are in particular the object of a direct bonding together. These assembled zones therefore extend from any connection between two portions of the conductive connection between portion of turns, preferably by direct bonding, without adding any material, by molecular adhesion.
- the device comprises a magnetic element placed in the interstitial space at least in a zone of said space located in the at least one turn;
- at least one among the first and the second substrate comprises an electrically conductive layer overmounted by a dielectric surface layer with said conductive layer comprising the corresponding portion of turn;
- the portion of turn formed on at least one among the first substrate and the second substrate is a conductive track;
- the materials of the first substrate and of the second substrate, on their first face, are different;
- the coil comprises a plurality of turns, with two successive turns of the plurality of turns being electrically connected by a conductive connection between a second end of a first portion of one of the two successive turns and a second end of a second portion of the other of the two successive turns.

A system is formed comprising a plurality of inductive components having first substrate in common and different second substrates.

The first and second portions are assembled mechanically at the same time as the electrical connection, by means of the conductive connection;

- the conductive connection is formed with at least one among the following conductive elements: an electrically conductive layer, an electrically conductive micro-tube, an electrically conductive ball, a paste or an anisotropic conductive film;
- on at least one among the first and the second portion, the following is carried out:
- depositing a dielectric layer;
- forming an opening in the dielectric layer, at the level of the first end;
- forming the conductive element in contact with said one among the first and the second portion, through the opening.

Forming the conductive element comprises the deposition of at least one electrically conductive layer on said one among the first and the second portion through the opening, and the deposition of a fusible bead on the electrically conductive layer. This at least one layer can be used for the mechanical connection to be produced. In particular, connections of the bead type (such as UBM described in particular here) make it possible to handle a mechanically stable cohesion.

- A melting is carried out of the fusible bead or of another conductive element during the assembly of the portions;
- the conductive connection is formed by direct bonding with or without thermocompression configured to assemble a zone in electrical continuity of the first end of the first portion and a zone in electrical continuity of the first end of the second portion.

the integration of a magnetic element into the interstitial space is carried out, at least in a zone of said space located in the at least one turn.

It is specified that, in the framework of this invention, the term "on" or "above" does not necessarily mean "in contact with". As such, for example, the deposition of a layer on another layer, does not necessarily mean that the two layers are directly in contact with one another but this means that one of the layers covers at least partially the other by being either directly in contact with it, or by being separated from it by a film, or another layer or another element.

It is specified that in the framework of this invention, the thickness of a layer is measured according to a direction perpendicular to the surface according to which this layer has its maximum extension.

An aspect of the invention is linked to the forming of portion of turns, advantageously in the form of conductive traces or tracks. Generally, all or a portion of these portions can be formed on one at least of the substrates. The term "on" means that the portions are carried by the substrate in question.

The may be not exclusively on one face, i.e. on one among the first and the second face of one of the substrates. This does not mean that said portions are necessarily finally apparent, exposed outwards, on one or the other of the substrates. For example, additional layers can cover the portion of turns after the manufacture thereof.

According to the invention, the term microelectronic device means a device comprising elements of micrometric and/or nanometric size. The same applies to the term "electronic component" which may be used here. Any system that has for its operation at least one electrical element falls within the scope of the invention. This microelectronic device can be a MEMS that has for example a mechanical and/or optical and/or photonic and/or electrical function.

The drawings, and the following description, focus for simplicity on the forming of a single inductive component but it is understood that several components can be manufactured simultaneously or successively on the same support or substrate, for example by gripping and placing a plurality of second substrates, by a technique such as flip chip (transfer via docking of chips).

Figure 1:
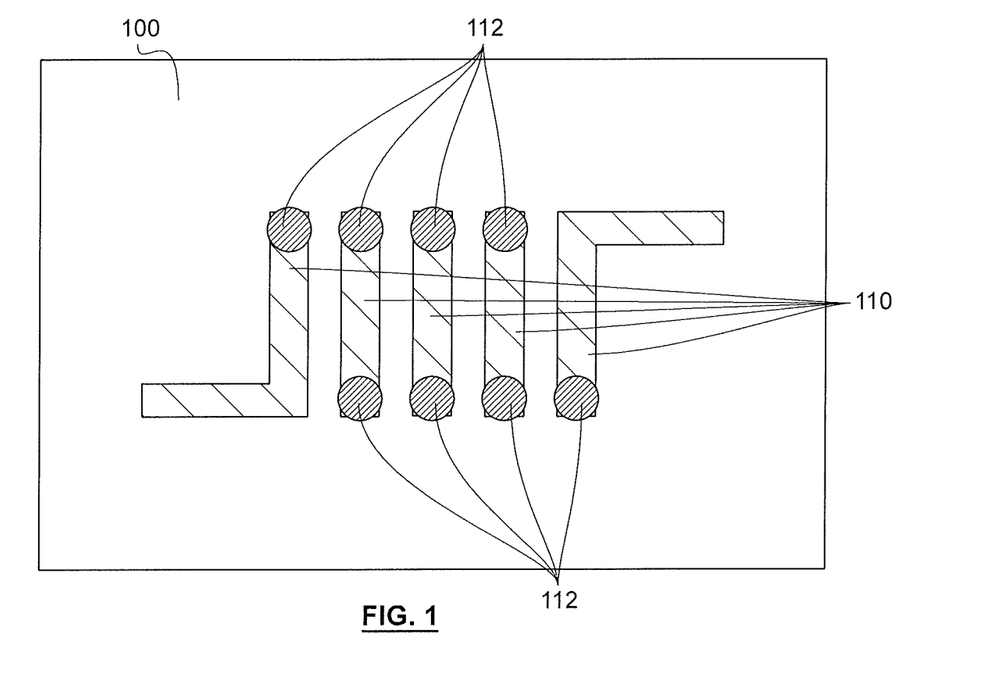
FIG. 1 shows the portion of turns of the inductive component of the invention which were carried out on a first substrate.

FIG. 1 diagrammatically shows, as a top view, a first support or substrate 100 from which it is possible to carry out an inductive component according to the invention. This first support is typically a substrate of the type of those commonly used by the microelectronics industry to produce all sorts of devices comprising at least one electric portion as already mentioned hereinabove. In the framework of the invention the term support therefore preferably means a substrate most often made from silicon, called a wafer. A wafer could typically initially be made of solid silicon or constitute an already elaborated product of the SOI type, i.e. silicon-on-insulator. The substrate can also, for example, be made of glass. Generally, the support can comprise several layers including at least one semi-conductive layer and at least one insulating layer. At the end of the steps of manufacturing the substrate may be cut into individual chips, with each one comprising one of the devices to be realized.

FIG. 1 is a plan view of the support 100 containing such an individual device whereon will also be carried out in a hybrid manner, as described hereinafter, at least one inductive component according to the invention.

The first support or substrate 100 is, for example, an integrated circuit (IC) realized conventionally with the methods developed by the microelectronics industry which, in the considered application, requires the use of an inductive component for its operation. The first support can also be an interposer comprising ICs manufactured independently and then transferred by different techniques such as bonding or "flip chip" soldering.

Advantageously, this passive component must be able to be placed as close as possible to the IC and carried out during the same cycle of manufacturing steps which the invention makes possible. In a standard manner the electronic components of an integrated circuit, typically field effect transistors (FET), are interconnected therein using many layers of planar metallization insulated from one another and located above these components. The upper face of the substrate 100 can be formed by the exposed surface of a layer 101 of an electrically insulating nature. If the underlying layer is made of silicon, the layer 101 (for example visible in FIG. 5) can be made of SiO2.

The first step of the invention consists in carrying out, advantageously at the same time as the last layer of metal interconnections, i.e. that located the closest to the surface in the stack of layers comprising the integrated circuit, the metal traces 110 which will form a first portion of the turns of an inductive component according to the invention. Optionally, the metal traces 110 can however be made after last layer of the integrated circuit has been carried out.

Note here that an inductive component according to the invention can, according to the applications, be carried out using any type of support 100 that allows for the deposition of a conductive layer allowing for the carrying out on its surface, in a standard manner via photolithography and etching, metal traces 110. This can in particular be metal traces on a substrate made of glass.

Mark 112 shows end zones of the traces 110 whereon electrical connections can place the traces 110 into continuity with the traces of a second substrate described hereinafter.

Figure 2:
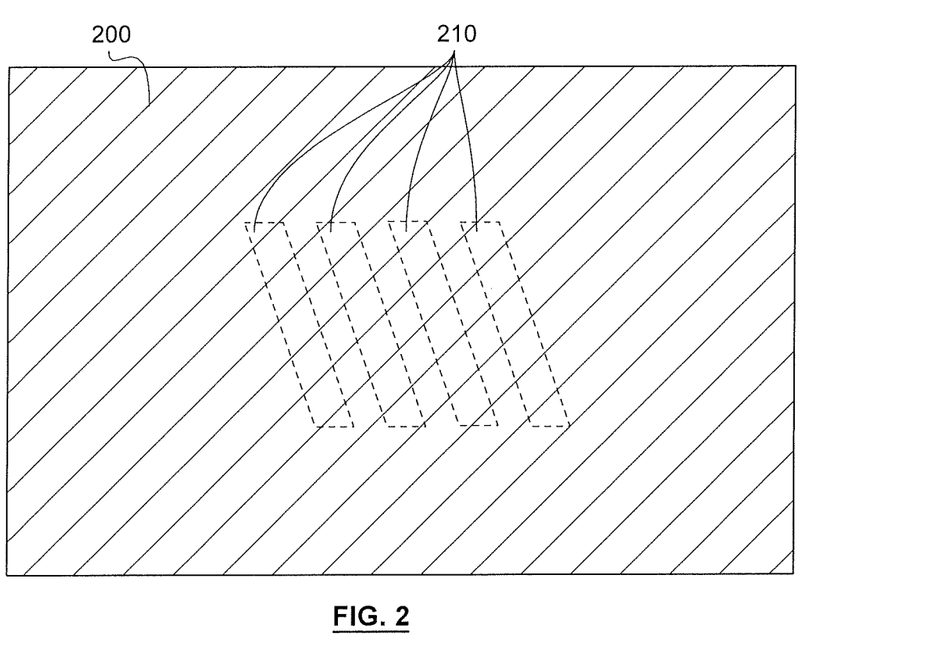
FIG. 2 shows the portion of turns of the inductive component of the invention which were carried out on a second substrate.

FIG. 2 is a plan view of a second substrate 200 whereon a second portion of the turns of an inductive component is carried out according to the invention, here also in the form of metal traces of which the patterns are adapted to allow, as shall be seen hereinafter, the interconnection thereof with the traces 110 of the first substrate in order to form in fine an electrically continuous coil forming an inductive component according to the invention. Note that the traces 210 are here shown as having been carried out on the hidden face of the second substrate after turning the latter over. As in the case of the first substrate, the second substrate can also comprise integrated circuits (IC).

The second substrate can be made of silicon, glass and of any other material suited for the carrying out of conductive traces on one at least of its surfaces.

Figure 3:
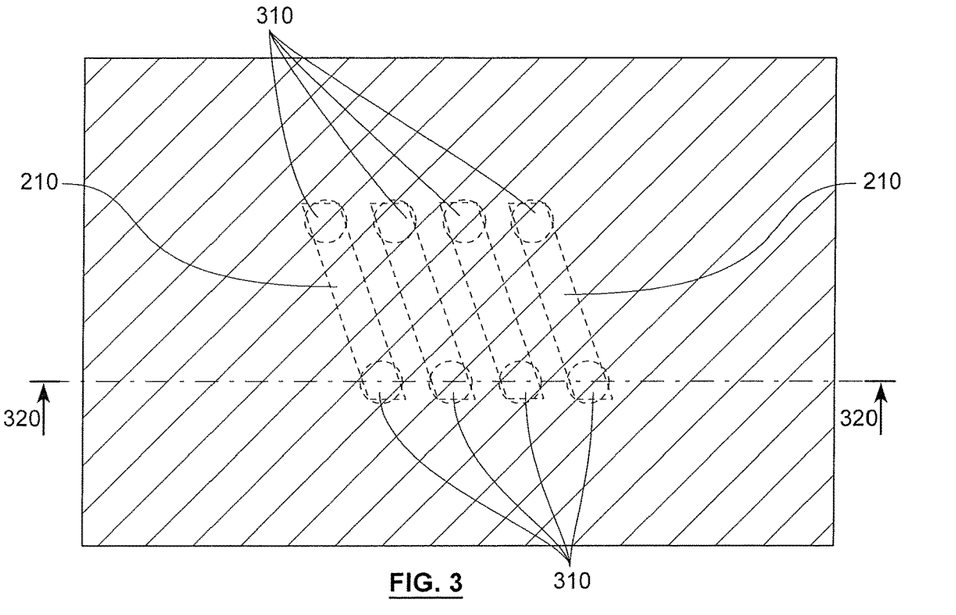
FIG. 3 is a plan view of the second substrate after the carrying out on the latter of the conductive connections between first substrate and second substrate.
Figure 4:
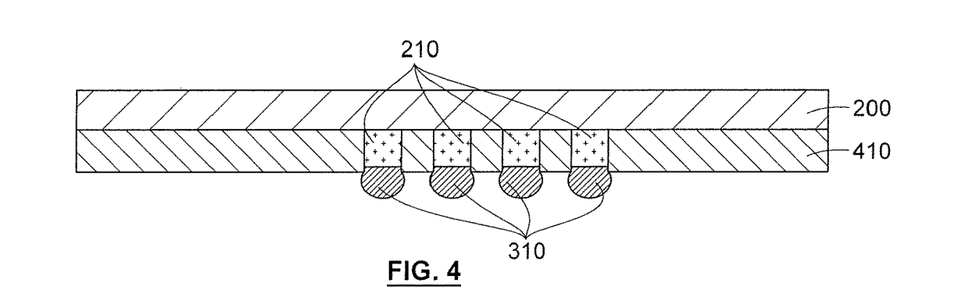
FIG. 4 is a cross-section view of the second substrate after the carrying out on the latter of the conductive connections between first and second substrate.

In the case of FIGS. 2 to 4, the substrate 200 comprises a lower face, opposite the upper face of the substrate 100, which is the exposed surface of an insulating layer. In this situation, for example with a support made of glass, there is no need for the deposition of an insulating surface layer.

Note that the conductive tracks or traces of the first substrate and second substrate may be formed without any inconvenience from the same conductive material, most generally a metal commonly used by the microelectronics industry such as aluminum or copper, or different materials.

The portion of turns, in the form of traces of the first substrate 100, are represented in the form of parallel strips that are advantageously of identical length and/or width. These strips are spaced according to a direction that defines the axis longitudinal of the coil. In the example, two end strips each comprise a connection with a connection trace of the coil.

The traces of the second substrate 200 are configured in order to be complementary with that of the first substrate 100, in such a way as to allow in the end the forming of a continuous chain alternating portions 110 and portions 210, are here also parallel between them, of the same width and length, and inclined relatively to the portions 110.

This inclination makes it possible to place a first end of a portion 210 at the level of a first end of portion 110, and a second end of said portion 210 at the level of a second end of another portion 110.

It is on these ends that the electrical connection between the portions of turn can be carried out.

As a note, the term "turn" here means according to a portion of coil extending in an open loop, with the ends of the loop being spaced according to the longitudinal axis of the coil, and being in the same plane parallel to said axis. This is therefore an elementary portion of the coil. At least one turn is formed. Generally, it is arranged that the surface whereon the traces of the portions 110, 210 repose, is not electrically conductive, in order to prevent short-circuits. This is therefore the case of the surface layer of the substrate 200 in FIGS. 4 and 5 and of the layer 101 in FIG. 5. Any configuration of a stacking of layers and of a choice of layer materials of the substrates 100, 200 allowing for this insulating is able to be suitable.

FIG. 3 is a plan view of the second substrate (after turning over the latter) whereon has been carried out in this example the interconnection system of the two substrates. Note here that the interconnection system of the two substrates which will, after the assembly of the latter, make it possible to form an inductive component according to the invention, is possibly prepared on one or the other of the two substrates or, jointly, on the two substrates separately.

In the example of FIG. 3 the system allowing for the interconnection of the two substrates is prepared on the second substrate alone in the form of beads or studs 310 intended to provide for a conductive connection between each one of the portion of turns of the first substrate and second substrate. The beads or studs are carried out by using well-known methods that are commonly implemented by the microelectronics industry. In particular, it is known how to carry out at the ends of the portion of turns 210 beads made from a tin-silver alloy (SnAg) or copper (Cu) studs such as those used for three-dimensional (3D) interconnections in microelectronics.

FIG. 4 is a cross-section view 320 of the second substrate 200 after the conductive connections (for example beads or studs) 310 between the two substrates have been prepared, in this example, at the ends of the portion of turns 210 of the second substrate. As shown in this figure, the portion of turns 210 are embedded in an isolating material 410 before realization of the conductive connections 310.

Figure 5:
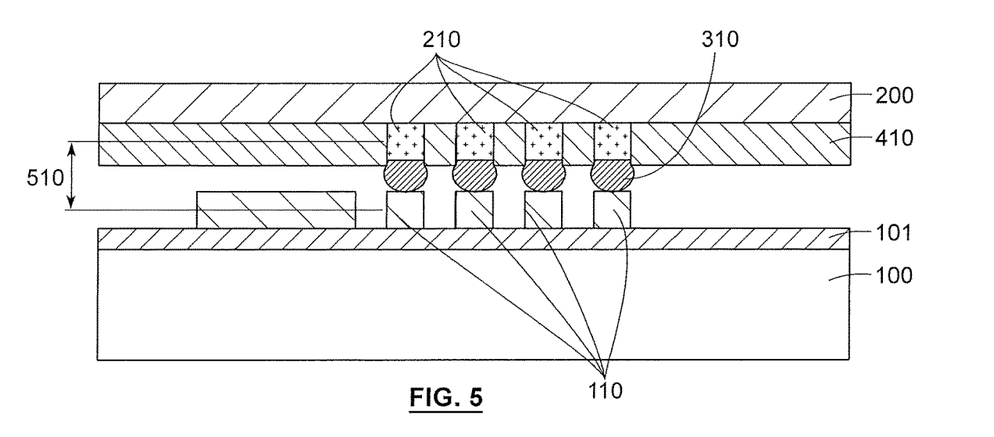
FIG. 5 is a cross-section view of the first substrate and second substrate after assembly.

FIG. 5 shows, as a cross-section, the inductive component obtained after turning over and positioning of the second substrate 200 and assembly of the latter on the first substrate 100. The method used referred to as "flip chip" is well known and widely used by the entire microelectronics industry. FIG. 5 shows the case of an interconnection that is both mechanical and electrical of the first substrate and second substrate which is carried out more particularly by implementing a well-known method called "solder reflow" i.e. remelting of the beads 310, in particular those made of SnAg mentioned hereinabove, in order to establish a good electrical connection between the portions of turn of the first substrate and second substrate, 110 and 210.

All of the interconnection methods used in a standard manner by the microelectronics industry are able to be used to allow for the assembly and the electrical interconnection of the two substrates. The methods that can be used are among others: direct bonding, thermocompression, microtubes or anisotropic conductive films (ACF). According to the type of interconnection of the substrates chosen very different heights 510 and sections of the inductive component created as such will be obtained which will largely condition the electrical value of the inductance. These heights can be included in a range of values less than the micron ($10^{-6}$ meter) in the method by direct bonding, up to a few tens of microns and even more in the case shown in FIG. 5 of remelting beads, for example of SnAg.

Note in FIG. 5 the presence of a passivation layer 101 on the first substrate.

The conductive connection 310 can also extend through one or several substrates inserted between the first substrate 100 and the second substrate 200. More precisely, the first face of the first substrate and the first face of the second substrate are not in this case simply spaced apart from one another; the space in between them is also here the location of the presence of at least one inserted substrate. The thickness of this substrate is more preferably oriented according to the same direction as that of the substrates 100, 200. It comprises a zone that passes through its thickness and allowing for electrical continuity with the rest of the conductive connection 310. The body of this inserted substrate can have a base of a conductive material, such as silicon. The technique of vias can be used to form these portions extending in the thickness of the inserted substrate.

Figure 9:
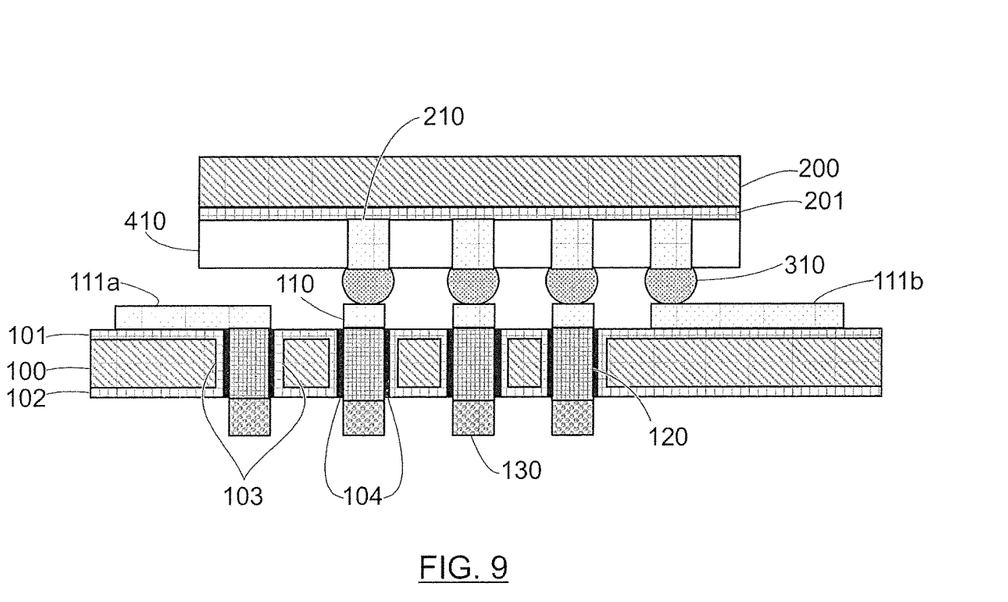
FIG. 9 shows a first alternative of the invention wherein the lower portion of the coil is carried out on the lower face of the first substrate.
Figure 10:
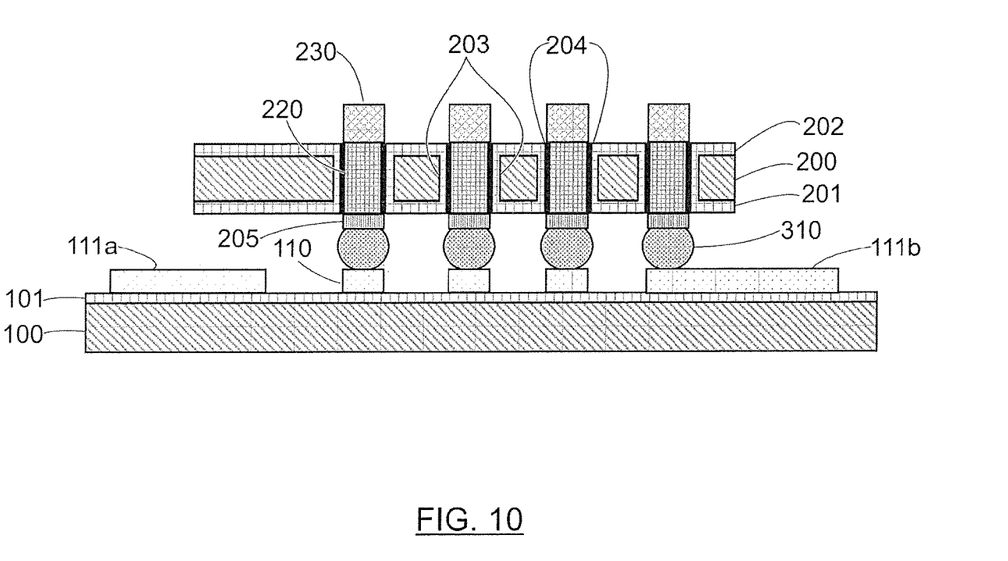
FIG. 10 shows a second alternative of the invention wherein the upper portion of the coil is carried out on the upper face of the second substrate.
Figure 11:
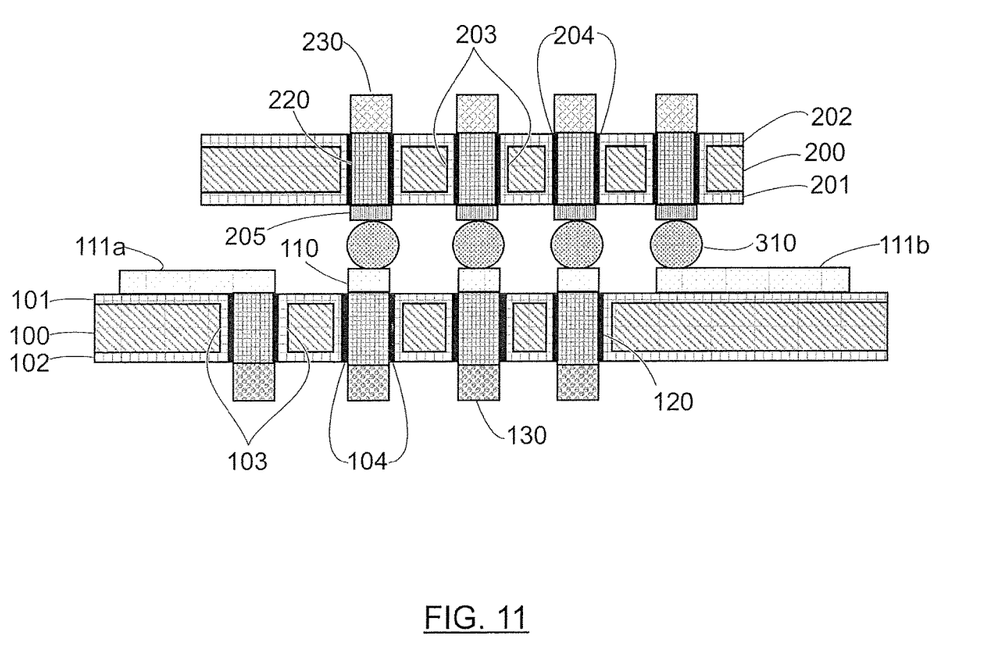
FIG. 11 shows a combination of the first alternative and of the second alternative of the invention described in FIGS. 9 and 10.

It is possible to stack several inserted substrates and connect their conductive portions participating in the connections 310. This connecting of substrates can be done according to any technique such as those described for a direct connecting of the first and of the second substrate 100, 200 in reference to the figures in particular. With regards to vias, the description of FIGS. 9 to 11 gives possibilities for realization that can be suited for inserted substrates.

Figure 6:
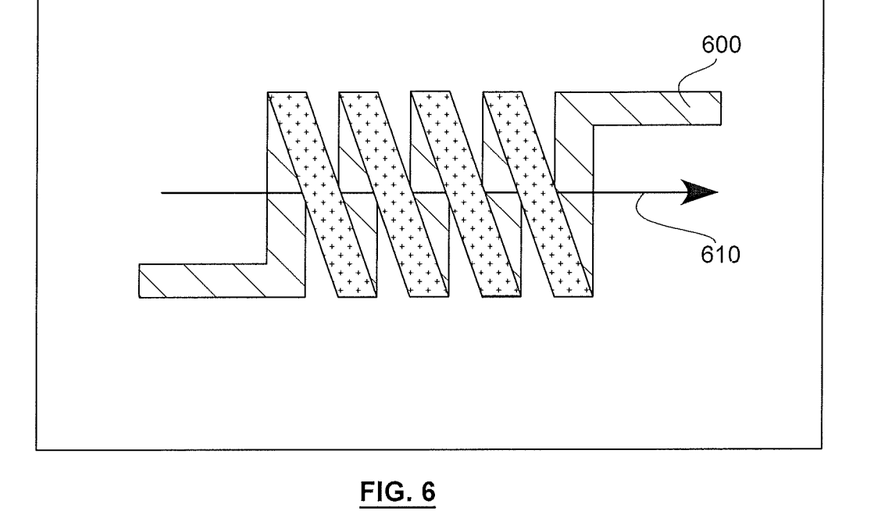

FIG. 6 shows a plan view of an inductive component 600 according to the invention that corresponds to the cross-section view of FIG. 5. The electrical axis of the component is that shown as 610. It is parallel to the plane of the assembled substrates 100 and 200.

Figure 7:
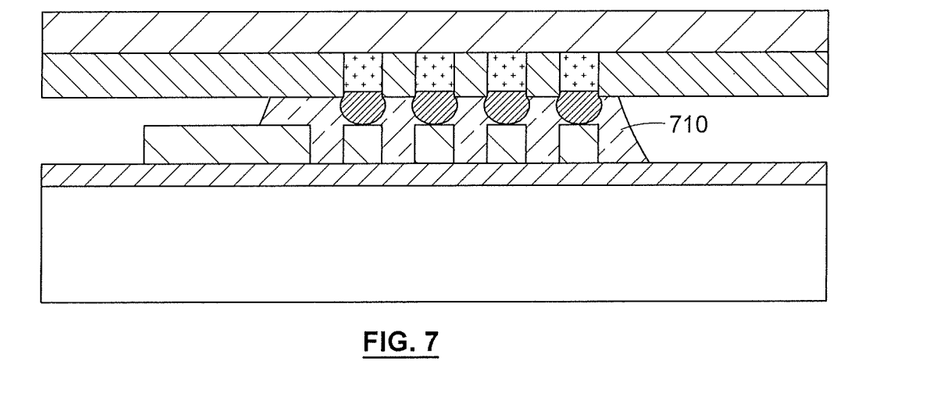
FIG. 7 is a cross-section view of the first substrate and second substrate assembled and filling of the interstitial space with a magnetic element intended to increase the value of the inductance.

FIG. 7 shows, in the form of a cross-section view similar to that of FIG. 5, the possibility offered by the invention of filling the interstitial space between the two substrates with a magnetic element 710 intended to increase the value of the inductance obtained. This increase is directly proportional to the value of the magnetic constant of the material used for the filling. To do this, either a filling is carried out using a liquid of the polymer resin type loaded with magnetic particles, or a material with equivalent properties is inserted that is commonly available in the form of thin films or wires.

Figure 8:
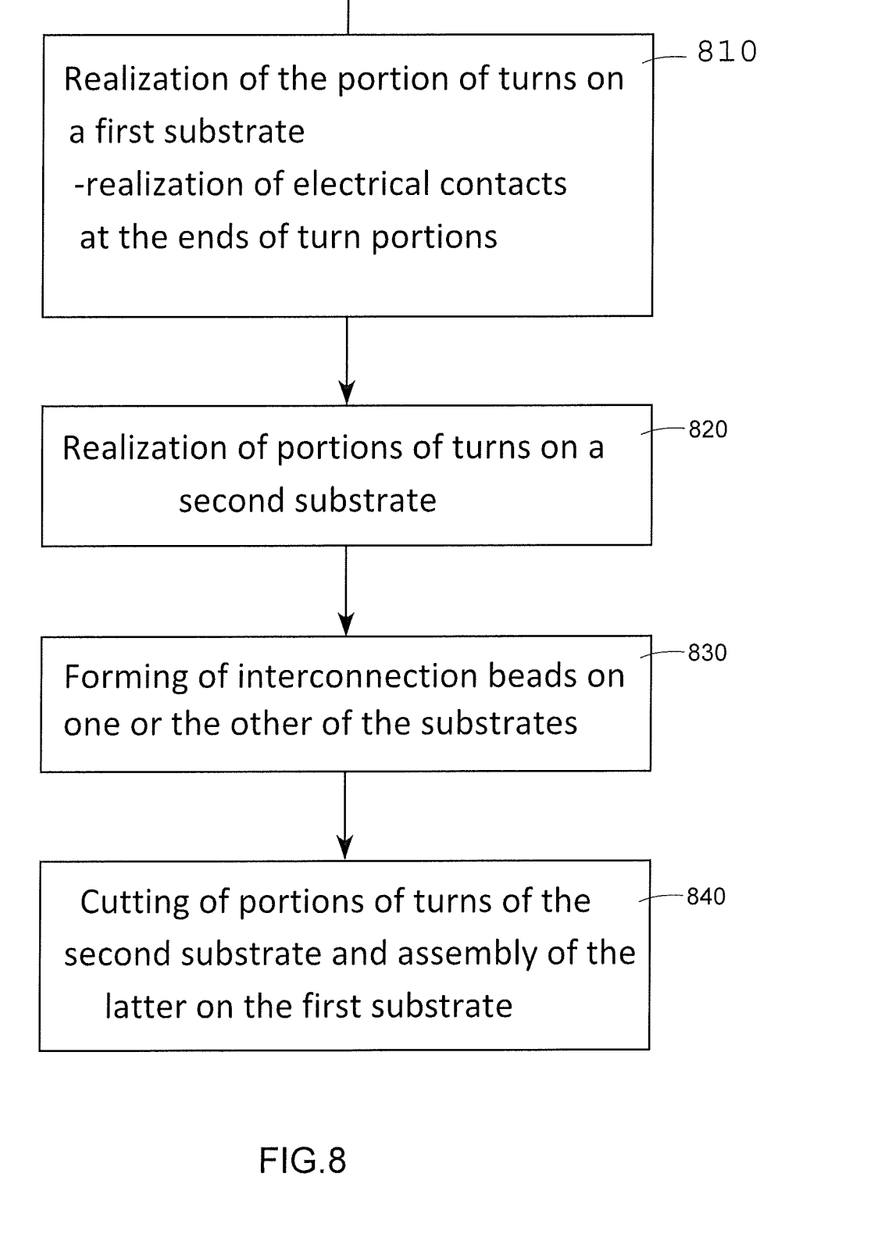
FIG. 8 shows the steps of the method for realizing an inductive element of the invention.

FIG. 8 summarizes the steps of the method which makes it possible to obtain an inductive component according to the invention.

In a first step 810, the portion of turns 110 of the first substrate 100 are carried out via photolithography and etching. Advantageously, they are made simultaneously with realization of the last level of metallization and interconnections of the integrated circuit using the inductive component of the invention 600. The integrated circuit serving as a support 100 is typically a so-called CMOS circuit, the currently most widely used technology which is uses FET transistors with a complementary (C) metal oxide semi-conductor (MOS) structure i.e. simultaneously using transistors of the two types of conduction: with an N channel and P channel. Advantageously, the portion of turns 110 are as such made from copper, commonly used to realize the interconnections of these integrated circuits. Typically, they are of a thickness of 3 microns. Note that in a standard manner the last layer of metal interconnections, and therefore the portion of turns 110, are then sandwiches between oxide layers (not shown) which provides for the electrical insulation thereof.

As shown in FIG. 1, also realized during this step are "wettable" surfaces at the ends of the portions of tracks 110 i.e. that are made via photolithography and etching of the upper oxide layer (not shown) which is typically silicon oxide (SiO2) of a thickness of 1 micron, openings 112 which make it possible to establish an electrical contact with the portion of turns 110. The size of the openings 112 depends on the technique retained for the interconnection of the first substrate and second substrate. Elle sera for example adapted to the size of the interconnection beads used. In this case, it may also be necessary to carry out a standard metallization of these openings referred to as UBM, (under bump metallization) intended to obtain, after the soldering by remelting, both good mechanical resistance and excellent electrical contact of the interconnection system by beads.

In a second step 820, the other portion of turns are carried out on a second substrate 200. This step includes the deposition of an insulating layer (not shown) if the substrate 200 is a wafer for example made from silicon or from another conductive material. A deposition can then be carried out, for example in the vapor phase, of a conductive layer of copper over a thickness, for example of about 3 microns. The portion of turns 210 of the second substrate are then carried out as in the preceding step by photolithography and etching of the layer of copper which has just been deposited.

Alternatively in order to form the first and/or the second conductive portions, an electrolytic growth can be carried out of a layer of copper of a thickness, for example of about 3 microns from a seed layer deposited beforehand on a continuous conductive bottom and selectively preserved according to the portions to be carried out.

In a third step 830, the interconnection of the first substrate and second substrate is prepared, for example in the form of a deposition of a fusible material such as the tin-silver alloy (SnAg) already mentioned hereinabove, in order to form by remelting beads of this material on one or the other of the substrates. The beads formed as such are typically of a diameter of 50 microns.

In the following step 840, where applicable a cut is made of the second substrate in such a way as to obtain as many discrete elements as there are portion of turns 210 that have been carried out on this second substrate 200. The, successively, after alignment, an assembly can be carried out of each one of the discrete elements obtained as such on the corresponding locations of the first substrate. As already described the assembly and the interconnection of the substrates is carried out via the so-called "flip chip" technique i.e. by turning over discrete elements coming from the second substrate and remelting of interconnection beads hereinabove.

Note here that the value of an inductive component is directly proportional to the section of the coil that forms it. When this inductive component is carried out entirely on an integrated circuit, for example by forming half of the turns on an insulating layer and half under the same insulating layer, then by carrying out the interconnections between the halves of the turns through this insulating layer, the rectangular section of the coil is approximated as being equal to the length of the half-turns, multiplied by the low thickness of the insulating layer. With the sole purpose of increasing the value of the inductance it is difficult to increase the thickness of the insulation without inconveniences for the method, for example of the CMOS type, which is used at the same time for realizing the integrated circuit. Depositing layers several microns thick, even a few tens of microns, can generate a stress on the substrate whereon the integrated circuit is carried out. Moreover, the etching of this layer can be a long and expensive operation as the standard methods are currently limited to about ten microns.

The invention therefore proposes a means for increasing the value of the inductance without the disadvantages hereinabove. The increase in the section of the coil is obtained as has been seen by increasing the distance between the portions of turn in a plane perpendicular to the axis of the latter. The coil is as such comprised of three assembled elements: metal traces corresponding to portion of turns carried out independently on two separate substrates, with one able to advantageously be the integrated circuit using the inductive component. The two substrates are then assembled face to face and interconnected using a third element such as interconnection beads which close the turns of the coil during the assembly as such making it possible to obtain a substantial section and therefore a high inductance value without inconveniences for the integrated circuit.

Unless specifically indicated otherwise, technical characteristics described in detail for a given embodiment can be combined with the technical characteristics described in the context of other embodiments described as non-limiting examples, of which those explained in more detail hereinbelow.

FIG. 9 shows an alternative of the invention wherein the conductive traces or tracks 130 of the first substrate forming the lower portion of the coil are in this case carried out on the lower face (or second face) of the substrate 100, i.e. on the face opposite the first face opposite the lower face (or first face) of the substrate 200. The electrical connection between these traces and therefore the conductive connection between the two substrates is then formed at least by vias 120 passing through the first substrate and by a conductor 110 arranged on the upper face of the latter. The input and the output of the coil are advantageously carried out on the upper face of the first substrate on elements 111a and 111b formed simultaneously with the conductive tracks 110. In order to obtain a whole number of turns, the input of the coil 111a may be connected to a via passing through the first substrate while the output 111b is connected to a connection element between the two substrates.

Note here that in order to ensure the electrical insulation of the turns of the coil the first substrate 100 comprises more preferably, unless itself it is made from an insulating material, two dielectric layers, 101 and 102, which will make it possible to electrically insulate the conductors of type 110 and 111 arranged on the upper face as well as the conductive tracks 130 on the lower face outside of the zones of vias shown in the cross-section view of the coil shown in FIG. 9. Typically, the first substrate is made of silicon and the dielectric layers, 101 and 102, are comprised of silicon oxide (SiO2). Also note that the vias 120 are conventionally electrically insulated from the substrate by a dielectric layer 103. In the case of the use of a metal material such as copper for the realization thereof a barrier layer 104 will also conventionally be found to prevent the diffusion of this material in the substrate. If copper is used for the other electrical connections, the use of a barrier layer (not shown) may be necessary.

The second substrate 200 remains identical to what was described with FIG. 4. Note the optional presence of a dielectric layer 201, already mentioned, which is necessary in the case wherein the second substrate is not comprised of an insulating material. Optionally, as already described in FIG. 4, the tracks 210 can themselves be included in an insulating layer 410.

FIG. 10 shows another alternative of the invention wherein the conductive traces or tracks 230 of the second substrate, constituting the upper portion of the coil, are in this case realized on the upper face of the substrate 200, i.e. on the face opposite the face opposite the lower face of the substrate 100. The electrical connection between these conductive tracks and the conductive connection between the two substrates is comprised at least by vias 220 passing through the second substrate and by a conductor 205 arranged on the lower face of the latter. The first substrate then remains identical to what was described in FIGS. 1 and 5. Similarly to what was described in the preceding figure note the presence of dielectric layers 201, 202 and 203 which provide the electrical insulation of the various conductive elements comprising the coil. In the case of the use of copper also note the use of a barrier layer shown only in this figure on the vias 220.

FIG. 11 shows another alternative of the invention that associates the structures of the first substrate and second substrate as described in FIGS. 9 and 10. Note that it is this latter structure that offers the largest section possible to the coil. As hereinabove, the space between the two substrates can optionally be filled, as shown in FIG. 7, with a material intended to increase the inductance value of the coil.

Also note that by using the structures described in FIGS. 10 and 11 it becomes possible to carry out coils by means of a stacking of more than two substrates and therefore a section of coil that is even larger. Reference will be made to the inserted substrates described hereinabove on this point.

In any case, the substrates can be assembled and connected, mechanically and electrically, by the intermediary of beads 310 as described hereinabove.

The invention can therefore have different zones for forming portion of turns (on the first face, on the second face or in one or the other of the first substrate and second substrate 100, 200) and/or different realizations of the conductive connection 310 with or without inserted substrates. These various configurations allow for substantial flexibility in the height of the coil.

The invention claimed is:

1. A microelectronic component comprising:
a coil provided with at least one electrically conductive turn comprising a first portion of turn formed on a first substrate, and a second portion of turn, with a first end of the first portion being electrically connected to a first end of the second portion by a conductive connection, with the coil having a longitudinal axis, around which the at least one turn is formed, which is perpendicular to a direction according to a thickness of the first substrate, wherein
the second portion is formed on a second substrate different from the first substrate, a first face of the first substrate facing a first face of the second substrate, and
at least one area of the first substrate and at least one area of the second substrate are separated by a gap that is free of any layer, the conductive connection extending at least into an interstitial space located between the first face of the first substrate and the first face of the second substrate; and
a magnetic element placed in the interstitial space at least in a zone of the interstitial space located in the at least one turn.

2. The component according to claim 1, wherein the first portion is formed on the first face of the first substrate or on a second face of the first substrate opposite the first face and/or the second portion is formed on the first face of the second substrate or on a second face of the second substrate opposite the first face.

3. The component according to claim 1, wherein the conductive connection comprises a portion that extends into the interstitial space and comprises a portion extending into at least one of the first substrate and second substrate.

4. The component according to claim 3, wherein the portion of the conductive connection extending into at least one of the first substrate and second substrate comprises at least one conductive via passing through said at least one of the first substrate and second substrate.

5. The component according to claim 1, wherein the conductive connection comprises at least one among the following elements: an electrically conductive layer, an electrically conductive micro-tube or an electrically conductive micropillar, an electrically conductive ball, a paste or an anisotropic conductive film.

6. The component according to claim 1, wherein the conductive connection is configured to produce a mechanical assembly of the first and second portions.

7. The component according to claim 1, wherein the conductive connection presents a non-zero dimension, according to the direction in thickness of the first substrate.

8. The component according to claim 1, wherein the conductive connection comprises a zone in electrical continuity of the first end of the first portion, a zone in electrical continuity of the first end of the second portion, said zones being assembled by direct bonding with or without thermocompression.

9. The component according to claim 1, wherein at least one among the first and the second substrates comprises an electrically conductive layer overmounted by a dielectric surface layer said electrically conductive layer containing one among the first or the second portions.

10. The component according to claim 1, wherein the portion of turn formed on at least one among the first substrate and the second substrate is a conductive track.

11. The component according to claim 1, wherein materials of the first substrate and second substrate, on their first face, are different.

12. The component according to claim 1, wherein the coil comprises a plurality of turns, with two successive turns of the plurality of turns being electrically connected by a conductive connection between a second end of a first portion of one of the two successive turns and a second end of a second portion of the other of the two successive turns.

13. An electronic system comprising at least one microelectronic component according to claim 1.

14. The system according to claim 13, comprising a plurality of microelectronic components having the first substrate in common and different second substrates.

15. The component according to claim 1, wherein the magnetic element comprises at least one of: a filling of a polymer resin loaded with magnetic particles, a thin film or wires of a magnetic material.

* * * * *